United States Patent
Masagaki et al.

(10) Patent No.: US 8,519,456 B2
(45) Date of Patent: Aug. 27, 2013

(54) SOLID-STATE IMAGE PICKUP DEVICE, IMAGE PICKUP APPARATUS INCLUDING THE SAME, AND METHOD OF MANUFACTURING THE SAME

(75) Inventors: Atsushi Masagaki, Kanagawa (JP); Ikuhiro Yamamura, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/892,017

(22) Filed: Sep. 28, 2010

(65) Prior Publication Data
US 2011/0079832 A1   Apr. 7, 2011

(30) Foreign Application Priority Data
Oct. 7, 2009   (JP) .................. 2009-233226

(51) Int. Cl.
*H01L 31/062* (2012.01)
*H01L 31/113* (2006.01)

(52) U.S. Cl.
USPC ........... 257/291; 257/292; 257/302; 257/329; 257/330; 257/332; 257/444; 257/E27.13; 257/E27.133; 257/E27.151; 257/E27.152; 438/7; 438/10; 438/28; 438/34; 438/56; 438/60; 438/75; 438/144; 438/211; 438/259

(58) Field of Classification Search
USPC ................. 257/291, 292, 302, 329, 330, 332, 257/444, E27.13, E27.133, E27.151, E27.152; 438/7, 10, 28, 34, 56, 60, 75, 144, 211, 259, 438/270
See application file for complete search history.

(56) References Cited
FOREIGN PATENT DOCUMENTS
JP   2006-311515   11/2006

*Primary Examiner* — Meiya Li
(74) *Attorney, Agent, or Firm* — Dentons US LLP

(57) ABSTRACT

A solid-state image pickup device in which electric charges accumulated in a photodiode conversion element are transferred to a second diffusion layer through a first diffusion layer.

5 Claims, 9 Drawing Sheets

FIG.2
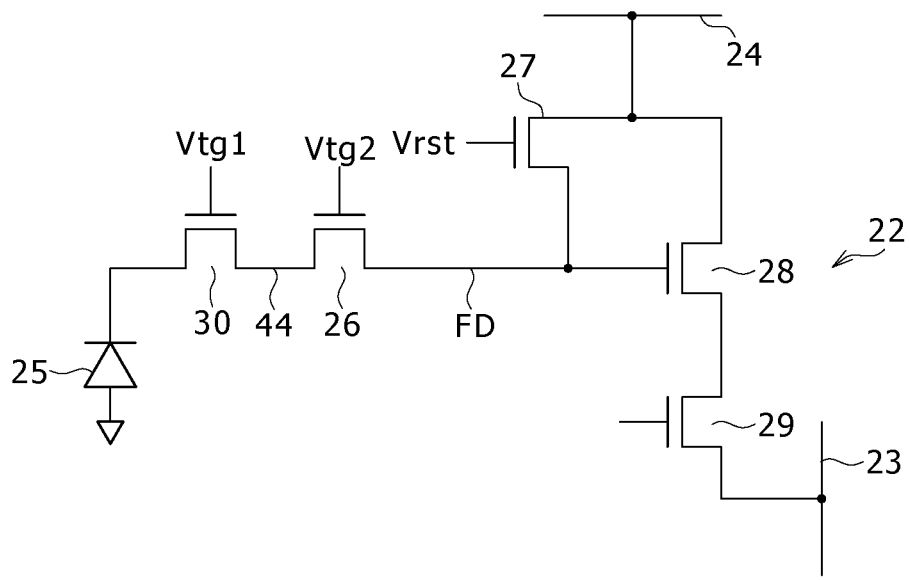
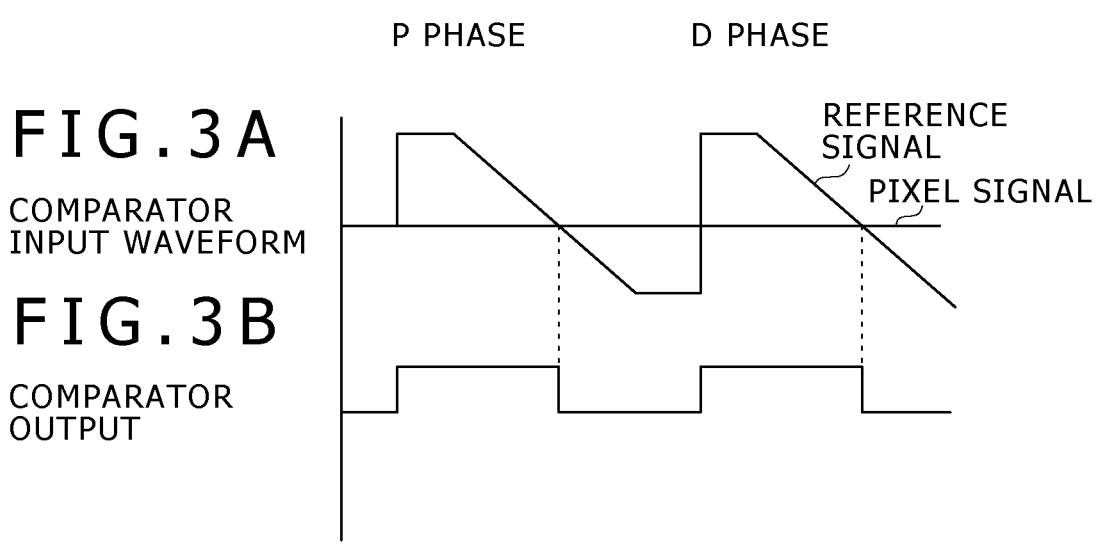
FIG.3A COMPARATOR INPUT WAVEFORM
FIG.3B COMPARATOR OUTPUT

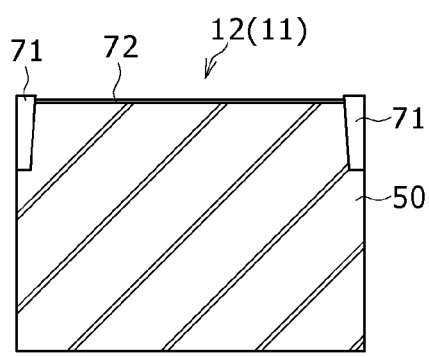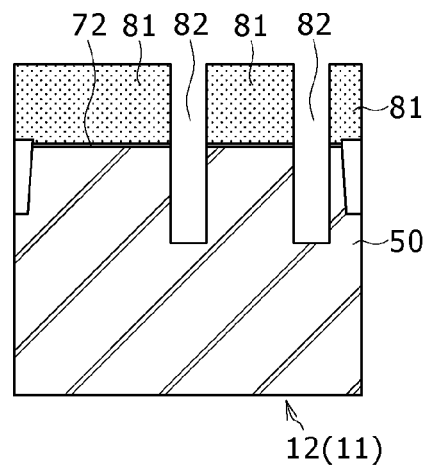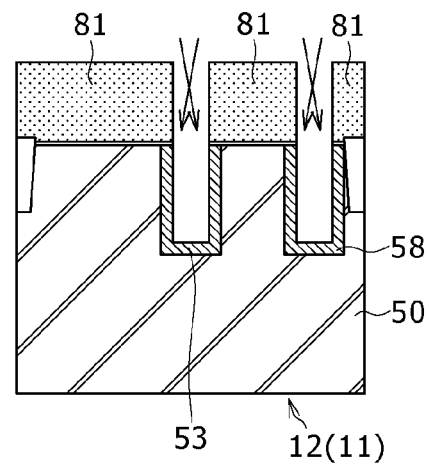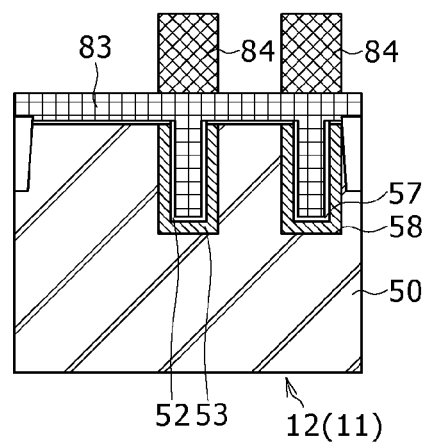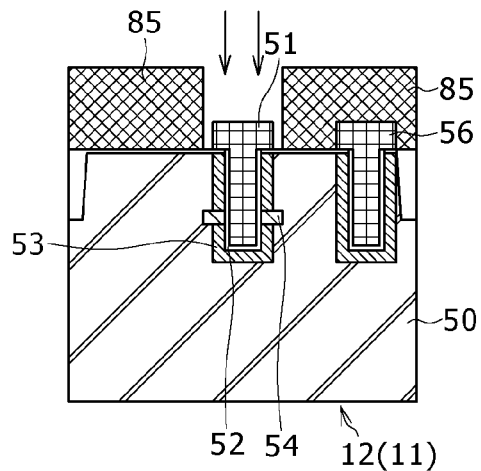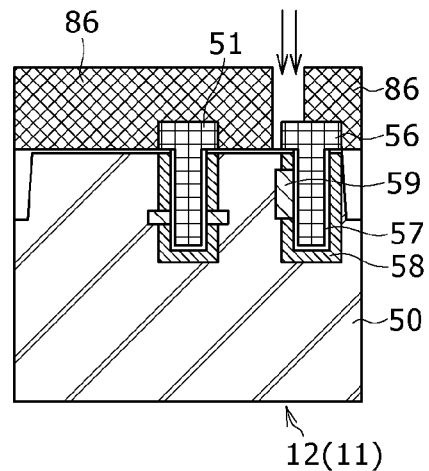

SOLID-STATE IMAGE PICKUP DEVICE, IMAGE PICKUP APPARATUS INCLUDING THE SAME, AND METHOD OF MANUFACTURING THE SAME

BACKGROUND OF THE INVENTION

1. Field of the Invention

The present invention relates to a solid-state image pickup device in which a plurality of photoelectric conversion elements are disposed on a semiconductor substrate, an image pickup apparatus including the same, and a method of manufacturing the same.

2. Description of the Related Art

Japanese Patent Laid-Open No. 2006-311515 (hereinafter referred to as Patent Document 1) discloses a solid-state image pickup device having a plurality of pixel circuits.

In each of the pixel circuits disposed in the solid-state image pickup device disclosed in Patent Document 1, a first transfer gate, a first floating diffusion layer, a second transfer gate, and a second floating diffusion layer are connected to a photodiode in this order.

Also, in each of the pixel circuits disposed in the solid-state image pickup device disclosed in Patent Document 1, the electric charges accumulated in the photodiode are supplied to a gate terminal of an amplifying transistor through the first transfer gate, the first floating diffusion layer, the second transfer gate, and the second floating diffusion layer.

In addition, the amplifying transfer causes a current corresponding to the electric charges accumulated in the photodiode to flow through an output signal line.

SUMMARY OF THE INVENTION

However, in each of the pixel circuits disposed in the solid-state image pickup device disclosed in Patent Document 1, the photodiode, the first transfer gate, the first floating diffusion layer, the second transfer gate, and the second floating diffusion layer are formed side by side in a light receiving area of the semiconductor substrate.

As a result, in the pixel circuit disposed in the solid-state image pickup device disclosed in Patent Document 1, an area of the photodiode in the light receiving area of the semiconductor substrate becomes small. When the area of the photodiode becomes small, a light receiving efficiency of the photodiode is reduced.

Also, in the pixel circuit disposed in the solid-state image pickup device disclosed in Patent Document 1, when a pitch of the photodiodes in a plurality of pixel circuits is set as the order of 1 micrometer or less (or the order of 2 micrometers or less), there is the possibility that a problem of reduction in the light receiving efficiency due to the reduction in the area of the photodiode is remarkably caused.

The present invention has been made in order to solve the problems described above, and it is therefore desirable to provide a solid-state image pickup device in which functionality is enhanced while reduction in an area of a photoelectric conversion element such as a photodiode is suppressed to the minimum, an image pickup apparatus including the same, and a method of manufacturing the same.

In order to attain the desire described above, according to an embodiment of the present invention, there is provided a solid-state image pickup device including: a semiconductor substrate; and a plurality of pixel circuits formed on the semiconductor substrate. Each of the plurality of pixel circuits formed on the semiconductor substrate includes: a photoelectric conversion element; a first buried gate electrode formed adjacent to the photoelectric conversion element; a second buried gate electrode formed away from each of the photoelectric conversion element and the first buried gate electrode; a first diffusion layer formed between the first buried gate electrode and the second buried gate electrode; and a second diffusion layer formed between the first buried gate electrode and the second buried gate electrode away from the first diffusion layer so as to overlap the first diffusion layer. Electric charges accumulated in the photodiode conversion element are transferred to the second diffusion layer through the first diffusion layer.

According to the embodiment of the present invention, the first diffusion layer and the second diffusion layer are each formed between the first buried gate electrode and the second buried gate electrode away from each other so as to overlap each other. Therefore, when one surface of the semiconductor substrate is viewed, an area which the first diffusion layer and the second diffusion layer use becomes an area of one diffusion layer. As a result, an area of the photoelectric conversion element of each of the pixel circuits in the semiconductor substrate becomes an area which is equal to an area in the case where only one of the first diffusion layer and the second diffusion layer is provided.

According to another embodiment of the present invention, there is provided an image pickup apparatus including: a solid-state image pickup device; and an optical system for imaging an image of a subject on the solid-state image pickup device. The solid-state image pickup device includes: a semiconductor substrate; and a plurality of pixel circuits formed on the semiconductor substrate. Each of the plurality of pixel circuits formed on the semiconductor substrate includes: a photoelectric conversion element; a first buried gate electrode formed adjacent to the photoelectric conversion element; a second buried gate electrode formed away from each of the photoelectric conversion element and the first buried gate electrode; a first diffusion layer formed between the first buried gate electrode and the second buried gate electrode; and a second diffusion layer formed between the first buried gate electrode and the second buried gate electrode away from the first diffusion layer so as to overlap the first diffusion layer. Electric charges accumulated in the photodiode conversion element are transferred to the second diffusion layer through the first diffusion layer.

According to still another embodiment of the present invention, there is provided a method of manufacturing a solid-state image pickup device including the steps of: forming a hole for a first buried gate electrode of each of a plurality of pixel circuits and a hole for a second buried gate electrode of each of the plurality of pixel circuits on one surface side of a semiconductor substrate in the solid-state image pickup device in which the plurality of pixel circuits are formed on the semiconductor substrate; forming a first impurity region and a second impurity region in a circumference of the hole for the first buried gate electrode and in a circumference of the hole for the second buried gate electrode, respectively; and forming the first buried gate electrode and the second buried gate electrode in the hole for the first buried gate electrode and in the hole for the second buried gate electrode, respectively. The method further includes the steps of: forming a first channel formation region having a lower impurity concentration than that of the first impurity region in a part of the first impurity region; forming a second channel formation region having a lower impurity concentration than that of the second impurity region in a part of the second impurity region; forming a photoelectric conversion element on the semiconductor substrate in a position contacting each of the first impurity region and the first channel formation region; and forming a second diffusion layer on one surface side of the semiconductor substrate between the first impurity region and the second impurity region so as to contact the second channel formation region, and forming a first diffusion layer within the semiconductor substrate away from the second diffusion layer so as to overlap the second diffusion layer and so as to contact each of the first channel formation region and the second channel formation region.

According to the present invention, the functionality can be enhanced while the reduction of the photoelectric conversion element such as the photodiode is suppressed to the minimum.

BRIEF DESCRIPTION OF THE DRAWINGS

FIG. 2 is a circuit diagram showing a configuration of a pixel circuit disposed in the CMOS image sensor shown in FIG. 1;

FIGS. 3A and 3B are respectively timing charts showing a period of time for reading of data for one row in the CMOS image sensor shown in FIG. 1;

FIGS. 7A to 7H are respectively cross sectional views of respective processes for manufacturing the pixel circuit shown in FIGS. 4 to 6;

DETAILED DESCRIPTION OF THE PREFERRED EMBODIMENTS

The preferred embodiments of the present invention will be described in detail hereinafter with reference to the accompanying drawings. It is noted that the description will be given below in accordance with the following order.

1. First Embodiment (solid-state image pickup device)
2. Second Embodiment (case where one floating diffusion (second diffusion layer) is formed for multiple pixel circuits)
3. Third Embodiment (image pickup apparatus)

1. First Embodiment

Configuration of CMOS Image Sensor

Figure 1:
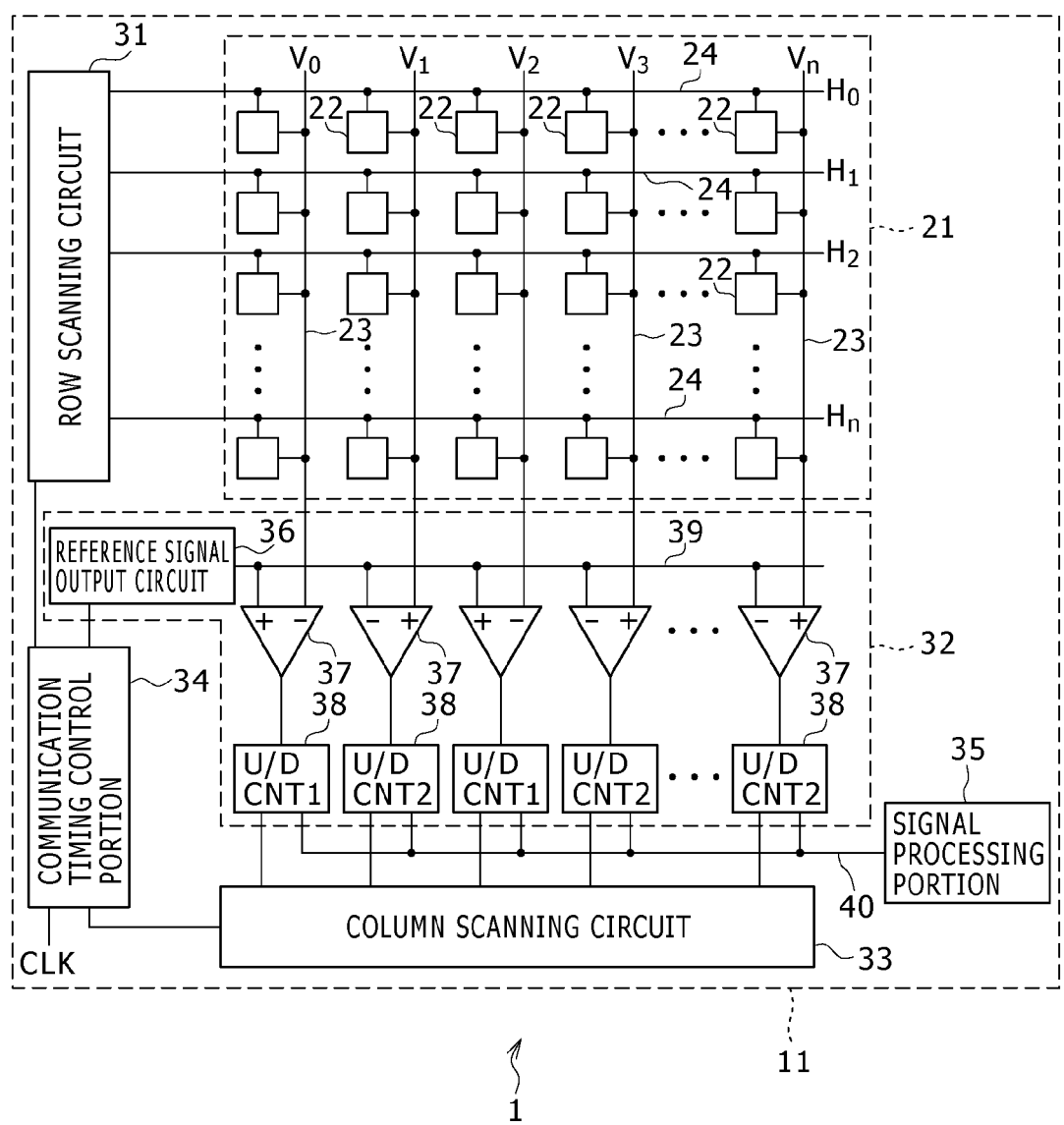
FIG. 1 is a block diagram, partly in circuit, showing a schematic layout of a CMOS image sensor as a solid-state image pickup device according to a first embodiment of the present invention.

FIG. 1 shows a schematic layout of a Complementary Metal Oxide Semiconductor (CMOS) image sensor 1 utilizing a column Analog-to-Digital (A/D) conversion system to which a solid-state image pickup device according to a first embodiment of the present invention is applied.

The CMOS image sensor 1 has a semiconductor substrate 11.

A light receiving area 21 is set in the semiconductor substrate 11.

The light receiving area 21 is a rectangular area in which an aspect ratio, for example, is set as either 3:4 or 9:16.

Also, a plurality of pixel circuits 22 are formed in the light receiving area 21.

A plurality of pixel circuits 22 are two-dimensionally disposed in a matrix in the light receiving area 21.

In addition, a plurality of column signal lines (read signal lines) 23, and a plurality of row signals 24 are wired in the light receiving area 21. In this case, the number of column signal lines 23 is the same as that of columns of the pixel circuits 22 which are two-dimensionally disposed. Also, the number of row signals 24 is the same as that of rows of the pixel circuits 22 which are two-dimensionally disposed.

Each of the column signal lines 23 extends vertically in FIG. 1, and is connected to a plurality of pixel circuits 22 disposed in a column.

Each of the row signal lines 24 extends horizontally in FIG. 1, and is connected to a plurality of pixel circuits 22 disposed in a row.

FIG. 2 is a circuit diagram showing a configuration of the pixel circuit 22 shown in FIG. 1.

The pixel circuit 22 includes a photodiode (photoelectric conversion element) 25, a first transfer transistor 30, a second transfer transistor 26, a reset transistor 27, an amplifying transistor 28, and a selecting transistor 29 as circuit elements.

The photodiode 25 is connected between a power source wiring (not shown) and a source electrode of the first transfer transistor 30.

When receiving a light, the photodiode 25 accumulates therein electric charges. In this case, the photodiode 25 accumulates therein an amount of electric charges corresponding to a light quantity of received light.

A drain electrode of the first transfer transistor 30 is connected to a drain electrode of the second transfer transistor 26 through a holding portion 44 composed of a buried diffusion layer 55 which will be described later (refer to FIG. 5).

Also, the first transfer transistor 30 is turned ON when a gate electrode thereof, for example, is controlled so as to have a High level, and connects the buried diffusion layer 55 to the photodiode 25. The electric charges accumulated in the photodiode 25 are moved to the buried diffusion layer 55.

A source electrode of the second transfer transistor 26 is connected to the buried diffusion layer 55. In addition, a drain electrode of the second transfer transistor 26 is connected to a floating diffusion FD composed of a surface diffusion layer 60 which will be described later.

The surface diffusion layer 60 is connected to a gate electrode of the amplifying transistor 28.

Also, the second transfer transistor 26 is turned ON when a gate electrode thereof, for example, is controlled so as to have the High level.

As a result, the buried diffusion layer 55 is connected to the surface diffusion layer 60 functioning as the floating diffusion FD.

In addition, a voltage level of the floating diffusion FD becomes a voltage level corresponding to an amount of electric charges in the buried diffusion layer 55.

A source electrode of the amplifying transistor 28 is connected to the row signal line 24. A drain electrode of the amplifying transistor 28 is connected to a source electrode of the selecting transistor 29.

Also, the amplifying transistor 28 causes a current corresponding to the voltage level of the floating diffusion FD connected to the gate electrode of the amplifying transistor 28 to flow through the selecting transistor 29.

A drain electrode of the selecting transistor 29 is connected to the column signal line 23.

Also, the selecting transistor 29 is turned ON when a gate electrode thereof, for example, is controlled so as to have the High level, and connects the amplifying transistor 28 to the column signal line 23. As a result, a current is caused to flow from the amplifying transistor 28 to the column signal line 23.

In such a pixel circuit 22, after the electric charges have been accumulated in the photodiode 25 for a given period of time, for example, the first transfer transistor 30, the second transfer transistor 26 and the selecting transistor 29 are each controlled so as to be turned ON.

In this case, the electric charges accumulated in the photodiode 25 are caused to flow into the floating diffusion FD through the first transfer transistor 30 and the second transfer transistor 26 each held in the ON state.

In addition, the amplifying transistor 28 causes a current corresponding to the potential of the floating diffusion FD to flow into the column signal line 23 through the selecting transistor 29 held in the ON state.

As a result, a voltage of the column signal line 23 has a voltage level corresponding to an amount of electric charges accumulated in the photodiode 25.

In addition, for the purpose of removing a so-called kTC noise and the like, in the pixel circuit 22, the reset transistor 27 and the selecting transistor 29 are each controlled so as to be held in the ON state.

When the reset transistor 27 is turned ON, the floating diffusion FD is connected to the row signal line 24.

In addition, a current corresponding to the potential of the floating diffusion FD held in a state in which the floating diffusion FD is connected to the row signal line 24 is caused to flow from the amplifying transistor 28 to the column signal line 23.

As a result, the voltage of the column signal line 23 has a voltage level corresponding to a reset potential of the floating diffusion FD.

In addition to a plurality of pixel circuits 22, a row scanning circuit 31, a column A/D conversion circuit 32, a column scanning circuit 33, a communication timing control portion 34, and a signal processing portion 35 are formed on the semiconductor substrate 11 of the CMOS image sensor 1 shown in FIG. 1.

The column A/D conversion circuit 32 creates signals containing therein count values corresponding to light quantities of received lights read out from a plurality of pixel circuits 22, respectively, and outputs these signals thus created to an output signal line 40.

For this reason, the column A/D conversion circuit 32 includes a reference signal output circuit 36, a plurality of comparators 37 the number of which is the same as that column signal lines 23, and a plurality of counters 38 the number of which is the same as that column signal lines 23.

The reference signal output circuit 36 is connected to the reference signal line 39.

Also, the reference signal output circuit 36 outputs a reference signal which is changed so as to have a ramp waveform to the reference signal line 39.

The comparators 37 are connected to the reference signal line 39 and the respective column signal lines 23.

Also, the comparator 37 outputs a signal at a High level when a voltage of the reference signal on the reference signal line 39 is higher than that of the corresponding one of the column signal lines 23. On the other hand, the comparator 37 outputs a signal at a Low level when the voltage of the reference signal on the reference signal line 39 is lower than that of the corresponding one of the column signal lines 23.

The counters 38 are connected to the respective comparators 37 and the output signal line 40.

Also, the counter 38 starts to carry out the counting from a predetermined timing, and then carries out the up-counting for a period of time until the output signal from the corresponding one of the comparators 37 is inverted from the High level to the Low level.

In addition, the counters 38 output signals containing therein the count values counted thereby to the output signal line 40.

The signal processing portion 35 is connected to the output signal line 40.

Also, as will be described later, the signal processing portion 35 subtracts a count value for a reset period of time (P phase) from a count value for a read period of time (D phase) every pixel circuit 22.

As a result, Correlation Double Sampling (CDS) processing is executed.

A result of the arithmetic operation about the subtraction is utilized as a value representing a quantity of light received by the photodiode 25 in each of the pixel circuits 22.

The row scanning circuit 31 is connected to a plurality of row signal lines 24.

Also, when data on a captured image is read out, the row scanning circuit 31, for example, controls a plurality of row signal lines 24 in order so as for a plurality of row signal lines 24 to become the High level.

As a result, a plurality of pixel circuits 22 are selected every one row.

The column scanning circuit 33 is connected to a plurality of counters 38 of the column A/D conversion circuit 32.

Also, the column scanning circuit 33 outputs output timing signals in order to a plurality of counters 38.

When the output timing signal is inputted to the counter 38, the counter 38 outputs a signal containing therein a count value to the output signal line 40.

As a result, a plurality of signals containing therein the count values counted by a plurality of counters 38, respectively, are outputted to the output signal line 40 in order.

The communication timing control portion 34 is connected to the row scanning circuit 31, the column scanning circuit 33, the reference signal output circuit 36, and the like.

Also, for the purpose of controlling an operation for reading out the data on the captured image from a plurality of pixel circuits 22, the communication timing control portion 34 controls the row scanning circuit 31, the column scanning circuit 33, the reference signal output circuit 36, and the like.

Operation for Reading Data on Captured Image from CMOS Image Sensor 1

Next, an operation for reading out the data on the captured image from the CMOS image sensor 1 shown in FIG. 1 will be described.

Hereinafter, a description will be given by exemplifying an operation utilizing a global shutter system in which the light reception is carried out approximately at the same time in all the pixels.

With the global shutter system, the exposure is carried out for all the pixels for a shutter period of time for which a time lag is hardly caused, and the electric charges accumulated in a plurality of photodiodes 25 in all the pixels are transferred to the holding portions 44 approximately at the same time.

It is noted that the general operation for reading out the data on the captured image from the CMOS image sensor 1 is an operation utilizing a rolling shutter system in which the reading operation is carried out one row by one row.

With the rolling shutter system, for example, the light reception is carried out every pixels belonging to one row.

With the global shutter system, the reset transistors 27 of a plurality of pixel circuits 22 in the CMOS image sensor 1 are reset at the same time.

In addition, after a lapse of a predetermined shutter period of time, the first transfer transistors 30 of a plurality of pixel circuits 22 in the CMOS image sensor 1 are controlled at the same time so as to be turned ON.

Note that, in a plurality of pixel circuits 22 in the CMOS image sensor 1, after a plurality of reset transistors 27 have been reset in order and continuously every one row, a plurality of first transfer transistors 30 may be controlled in order and continuously so as to be turned ON.

In this case as well, the operation for reading out the data on the captured image from the pixels every one row is not carried out in processing within the shutter period of time for all the pixels. For this reason, the reading operation can be completed for a short period of time as compared with the case of the rolling shutter system.

A plurality of photodiodes 25 receive lights, from a subject, condensed by an optical system after completion of the reset. Also, the amount of electric charges becomes an amount corresponding to a light quantity of light received in the photodiode 25.

Also, when a plurality of pixel circuits 22 are driven in accordance with the global shutter system, a plurality of holding portions 44 hold therein the electric charges accumulated in the respective photodiode 25 for a period of time from a reset timing common to all the pixel circuits 22 to an ON-timing.

After the electric charges corresponding to the light quantities of lights received by the photodiodes 25 have been accumulated in a plurality of holding portions 44, respectively, the CMOS image sensor 1 reads out the electric charges from a plurality of holding portions 44, respectively.

The captured image of the subject which the CMOS image sensor 1 creates is created based on a two-dimensional light quantity distribution (luminance distribution) expressed by the light quantities of lights received by a plurality of photodiodes 25, respectively.

When one sheet of image is captured, the row scanning circuit 31 controls a plurality of row signal lines 24 in order one line by one line so as for each of a plurality of row signal lines 24 to have the High level in accordance with the control made by the communication timing control portion 34.

In addition, for example, the column scanning circuit 33 controls a plurality of selecting circuits 29 in a plurality of pixel circuit 22 connected to the row signal line 24 controlled so as to have the High level and so as for each of a plurality of selecting circuits 29 to be held in ON state.

As a result, a plurality of pixel circuits 22 are selected one row by one row. A plurality of pixel circuits 22 belonging to one row selected, for example, output the voltages at the levels corresponding to the light quantities of received lights to a plurality of column signal lines 23, respectively.

The reference signal output circuit 36 outputs the reference signal having the ramp waveform, which changes from the High level to the Low level, twice every period of time for which the row scanning circuit 31 controls the row signal lines 24 so as for each of the row signal lines 24 to have the High level.

The column scanning circuit 33 outputs timing signals to start the counting to a plurality of counters 38 synchronously with the timings at which the reference signal output circuit 36 begins to output the respective reference signals.

FIGS. 3A and 3B are respectively timing charts showing signal waveforms for a read period of time for one row.

FIG. 3A shows a ramp waveform of the reference signal which the reference signal output circuit 36 outputs, and a waveform of the pixel signal (the signal at the voltage level which the pixel circuit 22 outputs to the column signal line 23).

FIG. 3B shows a waveform of the output signal from the comparator 37.

As shown in FIGS. 3A and 3B, the reference signal is controlled so as to have two ramp waveforms for the read period of time for one row.

The reference signal having the first ramp waveform is outputted for the reset period of time (P phase). Also, the reference signal having the second ramp waveform is outputted for the read period of time (D phase).

Also, for each of the period of time of the P phase and the period of time of the D phase, the voltage level of the reference signal agrees with the voltage of the pixel signal. At this agreement timing, the output voltage from the comparator 37 is inverted from the High level to the Low level.

In addition, the counter 38 carries out the counting-up operation for a period of time from the timing at which the reference signal, for example, is controlled so as to have the High level to a time point at which the output voltage from the comparator 37 is inverted.

The counter 38 counts two count values of the count value of the P phase and the count value of the D phase every read period of time for one row.

In addition, for the period of time for which the reference signal having the ramp waveform of the P phase is outputted, in a plurality of pixel circuits 22 belonging on one row selected, a plurality of reset transistors 27 are controlled so as to be turned ON.

Therefore, the voltage level of the pixel signal (the column signal line 23) becomes a voltage level corresponding to a reset potential of the floating diffusion FD of the pixel circuit in one row selected.

In addition, in the count processing in the P phase, the counter 38 counts a count value representing a period of time until the potential of the column signal line 23 caused by the floating diffusion FD, and the potential of the reference signal agree with each other.

For the period of time for which the reference signal having the ramp waveform of the D phase is outputted, in a plurality of pixel circuits 22 belonging to one row selected, a plurality of second transfer transistors 26 are controlled so as to be turned ON.

Therefore, the voltage level of the pixel signal (the column signal line 23) becomes a voltage level corresponding to the amount of electric charges held in the holding portion 44 of the pixel circuit 22 in one row selected.

In addition, in the count processing in the phase D, the counter 38 counts a count value representing a period of time until the potential of the column signal line 23 corresponding to the amount of electric charges held in the hold portion 44, and the potential of the reference signal agree with each other.

Each of a plurality of counters 38 outputs two count values counted thereby to the signal processing portion 35 through the output signal line 40.

The signal processing portion 35 subtracts the count value of the P phase from the count value of the D phase in each of the counters 38.

As a result, the light quantity distribution information (luminance distribution information) for one row is obtained from which the noise components in the pixel circuits 22 are removed away.

Also, the row scanning circuit 31 controls a plurality of row signal lines 24 in order one line by one line so as for each of a plurality of row signal lines 24 to have the High level. In addition, the row scanning circuit 31 repetitively carries out the control shown in FIGS. 3A and 3B every read period of time of each of the rows.

As a result, the light quantity distribution information (luminance distribution information) about one sheet of image is obtained.

Either the signal processing portion 35 or an image processing portion (not shown) connected to a subsequent stage of the signal processing portion 35 offsets a shortage of a color component of a color filter (not shown) from one sheet image of the light quantity distribution, thereby creating either a monochrome image or a full-color image.

The CMOS image sensor 1 outputs the image corresponding to the light quantity distribution, the monochrome image or the full-color image as the captured image.

Schematic Layout of Pixel Circuit 22

Next, a structure of the pixel circuit 22 of the CMOS image sensor 1 will be described in detail with reference to FIG. 4.

Figure 4:
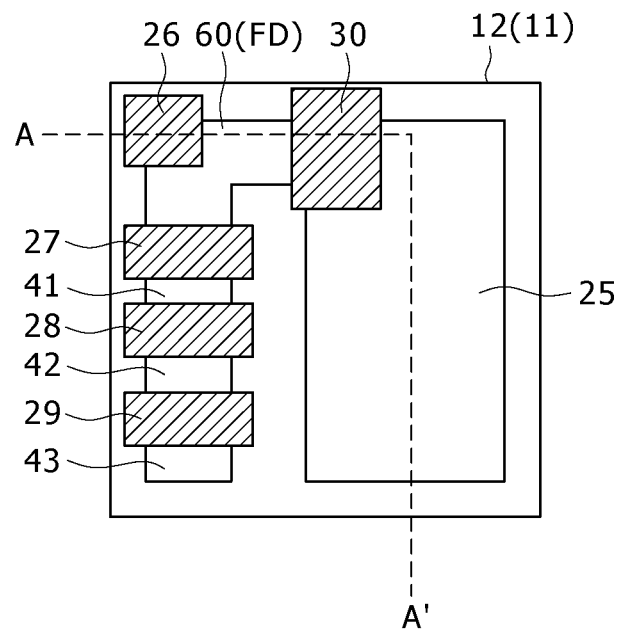
FIG. 4 is a top plan view showing a schematic layout of the pixel circuit shown in FIG. 2 with respect to a semiconductor substrate.

FIG. 4 is a schematic top plan view showing a schematic layout of an area 12 in which the pixel circuit 22 shown in FIG. 1 are formed with respect to the semiconductor substrate 11.

A plurality of pixel circuits 22 are two-dimensionally disposed in the light receiving area 21 of the semiconductor substrate 11.

FIG. 4 is a top plan view when the pixel circuit formation area 12 in which one pixel circuit 22 is formed is viewed from the light receiving area 21 side of the semiconductor substrate 11 shown in FIG. 1.

As shown in FIG. 2, the pixel circuit 22 includes the photodiode 25, the first transfer transistor 30, the holding portion 44, the second transfer transistor 26, the floating diffusion FD, the reset transistor 27, the amplifying transistor 28, and the selecting transistor 29.

These multiple circuit elements 25 to 30, 44 and FD, and a wiring portion through which these multiple circuit elements 25 to 30, 44 and FD are electrically connected to one another are formed in the pixel circuit formation area 12.

The photodiode 25 is formed in a right half of the quadrangular pixel circuit formation area 12 shown in FIG. 4. The photodiodes 25 of a plurality of pixel circuits 22 are formed in the light receiving area 21 of the semiconductor substrate 11 side by side either on the order of 1 micrometer or less or at a pitch of 2 micrometers or less.

In FIG. 4, the photodiode 25 is formed so as to occupy a width of about 60% which is equal to or larger than a half of a width of the pixel circuit formation area 12.

In addition, the floating diffusion FD is formed in an upper portion of a left half of the quadrangular pixel circuit formation area 12 shown in FIG. 4.

The gate electrode of the first transfer transistor 30 is formed between the floating diffusion FD and the photodiode 25.

In addition, the gate electrode of the second transfer transistor 26 is formed in an upper-left corner portion of the quadrangular pixel circuit formation area 12 shown in FIG. 4.

Also, the gate electrode of the reset transistor 27, the gate electrode of the amplifying transistor 28 and the gate electrode of the selecting transistor 29 are formed in an area from a middle portion to a lower portion of the left half of the quadrangular pixel circuit formation area 12 shown in FIG. 4.

The reset transistor 27, the amplifying transistor 28, and the selecting transistor 29 are collectively formed so as to be vertically disposed side by side in FIG. 4.

In addition, the gate electrode of the reset transistor 27 is formed adjacent to the floating diffusion FD.

A wiring portion 41 is formed between the gate electrode of the reset transistor 27 and the gate electrode of the amplifying transistor 28.

A wiring portion 42 is formed between the gate electrode of the amplifying transistor 28 and the gate electrode of the selecting transistor 29.

Also, a wiring portion 43 is formed on a lower side of the gate electrode of the selecting transistor 29 so as to be connected to the column signal line 23.

Lamination Structure of Pixel Circuit 22

Figure 5:
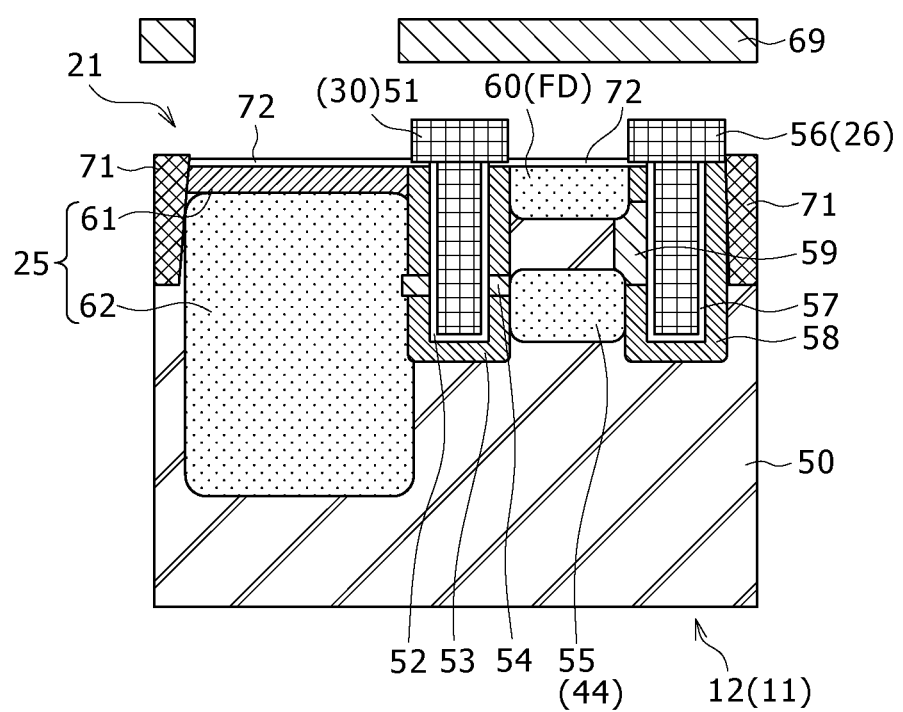
FIG. 5 is a cross sectional view taken on line A-A' of FIG. 4.

FIG. 5 is a partially longitudinal cross sectional view of the semiconductor substrate 11 showing a lamination structure of the pixel circuit 22 shown in FIG. 4.

FIG. 5 is a cross sectional view taken on line A-A' of FIG. 4.

Also, FIG. 5 shows an inside of a P-type well 50 in one pixel circuit formation area 12.

In addition, FIG. 5 shows a light blocking film 69 in such a way that the light blocking film 69 overlaps in position the light receiving area 21 of the semiconductor substrate 11.

The light blocking film 69 has an opening portion in a position where the photodiode 25 is formed.

Also, the light blocking film 69 blocks the light which is intended to be made incident to the semiconductor substrate 11 in a portion thereof other than the opening portion.

The semiconductor substrate 11 of the CMOS image sensor 1 is the N-type semiconductor substrate 11.

The P-type well 50 is formed in a region to a position at a predetermined depth (for example, 3 micrometers) in the light receiving area 21 of the semiconductor substrate 11. The P-type well 50, for example, is formed throughout the light receiving area 21. A plurality of pixel circuits 22 are formed within the P-type well 50 side by side.

The P-type well 50 formed throughout the light receiving area 21 is separated into a plurality of pixel circuit formation areas 12 by an isolation portion 71.

In addition, an oxide film 72 is formed in each of surfaces of the pixel circuit formation areas 12 obtained through the separation by using the isolation portion 71.

The photodiode 25, the first transfer transistor 30, the holding portion 44, the second transfer transistor 26, the floating diffusion FD, the reset transistor 27, the amplifying transistor 28, and the selecting transistor 29 as the circuit elements of the pixel circuit 22 shown in FIG. 2, and the wiring are formed in each of the pixel circuit formation areas 12 which are obtained through the separation by using the isolation portion 71 so as to correspond to the pixel circuits, respectively.

Also, as shown in FIG. 5, the photodiode 25, the first transfer transistor 30, the buried diffusion layer 55, the second transfer transistor 26, and the surface diffusion layer 60 are formed in the pixel circuit formation area 12.

The buried diffusion layer 55 functions as the holding portion 44.

The surface diffusion layer 60 functions as the floating diffusion FD.

The photodiode 25 is the buried photodiode 25.

The photodiode 25 has a P+-type region 61 formed on one surface side of the light receiving area 21 of the semiconductor substrate 11, and an N-type region 62 formed inside the semiconductor substrate 11 so as to underlie the P+-type region 61.

The buried photodiode 25, for example, is formed in a range from one surface side of the light receiving area 21 of the semiconductor substrate 11 to a position at a depth of 1 to 3 micrometers.

As a result, the buried photodiode 25 can accumulate therein a large amount of electric charges.

Note that, all it takes is that the buried photodiode 25 is formed in such a way that a potential gradient, for example, is obtained to a depth of about 3 micrometers in correspondence to an absorption coefficient of a light of silicon (Si) composing the N-type semiconductor substrate 11.

As a result, the sensitivity of the photodiode 25 can be ensured by utilizing the electrons generated in a position at a depth of about 3 micrometers.

The first transfer transistor 30 includes a first buried gate electrode 51, a first oxide film 52, a first impurity region 53, and a first channel formation region 54.

Also, the first transfer transistor 30 is formed adjacent to the buried photodiode 25.

The first buried gate electrode 51 is formed so as to be buried in the semiconductor substrate 11.

Specifically, the first buried gate electrode 51 is formed in a range from one surface side of the light receiving area 21 of the semiconductor substrate 11 to a position at a depth of reaching the N-type region 62 of the buried photodiode 25.

All it takes is that the first buried gate electrode 51 is formed from one surface side of the light receiving area 21 of the semiconductor substrate 11 to the position at the depth of 1.0 to 1.5 micrometers.

The first oxide film 52 covers the first buried gate electrode 51.

The first impurity region 53 covers the first oxide film 52.

The first impurity region 53 is a P-type semiconductor region which is opposite in conductivity type to the N-type region 62.

The first channel formation region 54 is formed as a part of the first impurity region 53 in the inside distant from one surface side of the light receiving area 21 of the semiconductor substrate 11.

The first channel formation region 54 is a P-type semiconductor region which is lower in impurity concentration than the first impurity region 53.

Also, the first impurity region 53 is formed at a high impurity concentration so as to obtain a sufficient potential difference between the first impurity region 53 and the first channel formation region 54 when the first buried gate electrode 51 is held in the ON state.

In addition, the first impurity region 53 is formed at a high impurity concentration so as not to cause the unnecessary movement of the electric charges in any of the portions other than a portion between the photodiode 25 and the buried diffusion layer 55.

Figure 6:
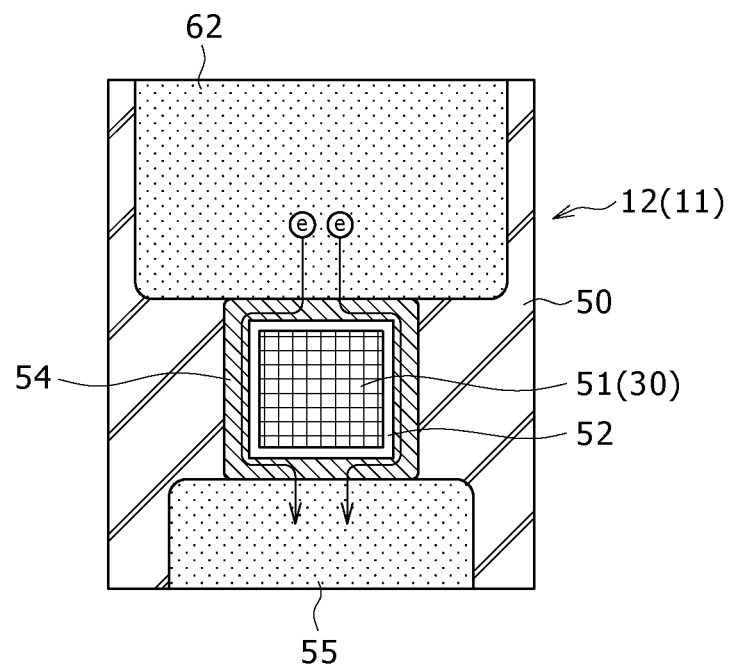
FIG. 6 is a transverse cross sectional view of a first channel formation region shown in FIG. 5.

FIG. 6 is a partially transverse cross sectional view of the semiconductor substrate 11 at a depth at which the first channel formation region 54 is formed.

As shown in FIG. 6, the first oxide film 52 is formed in the circumference of the first buried gate electrode 51.

The first channel formation region 54 is formed in the circumference of the first oxide film 52.

The first channel formation region 54 contacts each of the N-type region 62 of the buried photodiode 25, and the buried diffusion layer 55.

Also, when a predetermined potential is applied to the first buried gate electrode 51, the electric charges accumulated in the N-type region 62 of the photodiode 25 are moved to the buried diffusion layer 55 through the first channel formation region 54.

As shown in FIG. 5, the buried diffusion layer 55 functioning as the holding portion 44 is formed away from one surface side of the light receiving area 21 of the semiconductor substrate 11 so as to be buried in the semiconductor substrate 11.

The buried diffusion layer 55 is an N-type semiconductor region.

In addition, the buried diffusion layer 55 contacts each of the first channel formation region 54 of the first transfer transistor 30, and a second channel formation region 59 which will be described later of the second transfer transistor 26.

Note that, all it takes is that the buried diffusion layer 55 is formed in depth position thereof at a depth at which an average range distance Rp from one surface side of the light receiving area 21 of the semiconductor substrate 11 becomes in depth thereof 1 micrometer.

In addition, for the purpose of ensuring an electric charge accumulation capacity of the photodiode 25 with a smaller area, the impurity concentration of the buried diffusion layer 55 is made higher than that of the N-type region 62 of the photodiode 25.

In addition, as will be described later, the impurity concentration of the buried diffusion layer 55 is set as not being so too high as to be able to be perfectly depleted in a phase of the reset.

The second transfer transistor 26 includes a second buried gate electrode 56, a second oxide film 57, a second impurity region 58, and a second channel formation region 59.

Also, the second transfer transistor 26 is formed in a position located away from each of the first transfer transistor 30 and the photodiode 25.

The second buried gate electrode 56 is formed so as to be buried in the semiconductor substrate 11.

Specifically, the second buried gate electrode 56 is formed in a range from one surface side of the light receiving area 21 of the semiconductor substrate 11 to a position at a depth of reaching the buried diffusion layer 55.

The second oxide film 57 covers the second buried gate electrode 56.

The second impurity region 58 covers the second oxide film 57.

The second impurity region 58 is a P-type semiconductor region which is opposite in conductivity type to the buried diffusion layer 55.

The second channel formation region 59 is formed as a part of the second impurity region 58 in the inside distant from one surface side of the light receiving area 21 of the semiconductor substrate 11.

The second channel formation region 59 is a P-type semiconductor region which is lower in impurity concentration than the second impurity region 58.

Also, the second channel formation region 59 contacts each of the buried diffusion layer 55 and the surface diffusion layer 60.

It is noted that the second impurity region 58 is formed at a high impurity concentration so as to obtain the sufficient potential difference between the second impurity region 58 and the second channel formation region 59 when the second buried gate electrode 56 is held in the ON state.

In addition, the second impurity region 58 is formed at the high impurity concentration so as not to cause the unnecessary movement of the electric charges in any of the portions other than a portion between the buried diffusion layer 55 and the surface diffusion later 60.

The surface diffusion layer 60 functioning as the floating diffusion FD is formed on one surface side of the light receiving area 21 of the semiconductor substrate 11.

The surface diffusion layer 60 is an N-type semiconductor region.

An impurity concentration of the surface diffusion layer 60 is set as being high in order to obtain the contact with the wiring portion.

In addition, the surface diffusion layer 60 is formed between the first impurity region 53 of the first transfer transistor 30, and the second impurity region 58 of the second transfer transistor 26, and contacts the second channel formation region 59 of the second transfer transistor 26.

Note that, it is better that a PN junction portion between the second channel formation region 59 and the surface diffusion layer 60 is located in a range from one surface side of the light receiving area 21 of the semiconductor substrate 11 to a position at a depth of 0.5 micrometers.

As a result, the depth of the PN junction portion of the floating diffusion FD can be made equal to that of the general CMOS image sensor 1.

In addition, the impurity concentrations of the first channel formation region 54, the buried diffusion layer 55, the second channel formation region 59, and the surface diffusion layer 60 shown in FIG. 5 are adjusted as follows.

That is to say, the impurity concentration of the first channel formation region 54, for example, is adjusted in such a way that when each of the first buried gate electrode 51 and the second buried gate electrode 56 is turned ON in the phase of the reset or the like, the potential of the first channel formation region 54 becomes higher than that of the N-type region 62 of the photodiode 25 accumulating therein the electric charges.

In addition, the impurity concentrations of the first channel formation region 54, the buried diffusion layer 55, the second channel formation region 59, and the surface diffusion layer 60 are adjusted in such a way that the potential of the first channel formation region 54, the potential of the buried diffusion layer 55, the potential of the second channel formation region 59, and the potential of the surface diffusion layer 60 become high in this order under the same conditions.

In this case, the impurity concentration of the surface diffusion layer 60 becomes higher than that of the buried diffusion layer 55.

By combining these impurity concentrations with one another, the electric charges held in the buried diffusion layer 55 can be all moved to the surface diffusion layer 60.

As a result, after completion of the reset in which the second buried gate electrode 56 is turned ON to move the electric charges, the buried diffusion layer 55 becomes perfectly a non-electrification state (completely depleted). Thus, the buried diffusion layer 55 is perfectly depleted.

Method of Manufacturing Pixel Circuit 22

FIGS. 7A to 7H are respectively cross sectional views explaining manufacturing processes for forming the circuit elements such as the photodiode 25, the first transfer transistor 30, the holding portion 44, the second transfer transistor 26, the floating diffusion FD, the reset transistor 27, the amplifying transistor 28, and the selecting transistor 29 of the pixel circuit 22 in the P-type well 50 of the semiconductor substrate 11.

Figure 7G:
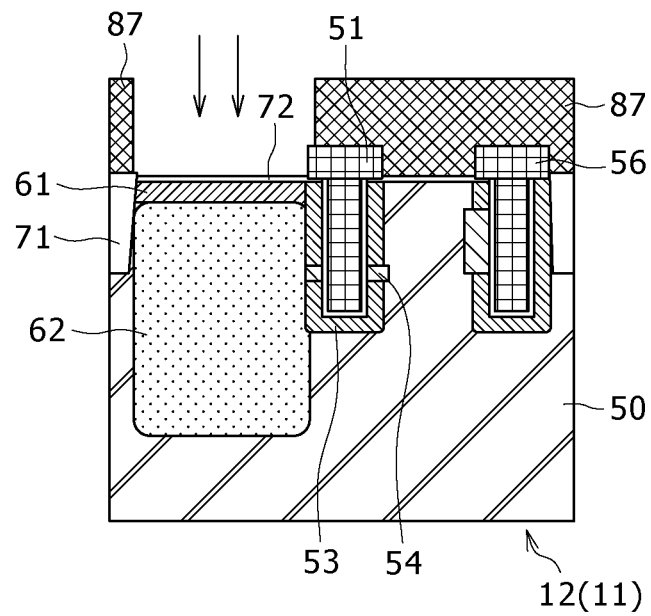

In the manufacturing processes shown in FIGS. 7A to 7H, firstly, as shown in FIG. 7A, the isolation portion 71 and the oxide film 72 are each formed in the light receiving area 21 in which the P-type well 50 of the semiconductor substrate 11 is formed.

The isolation portion 71 can be formed by utilizing a Shallow Trench Isolation (STI) method, a Local Oxidation of Silicon (LOCOS) method or the like.

After the isolation portion 71 and the oxide film 72 have been each formed in the P-type well 50 of the substrate 11, as shown in FIG. 7B, a hole for the first buried gate electrode 51, and a hole for the second buried gate electrode 56 are each formed in the light receiving area 21 of the semiconductor substrate 11.

Specifically, a resist film 81 having a pattern complementary with a deposition pattern of the first and second buried gate electrodes 51 and 56 is formed on the P-type well 50 of the semiconductor substrate 11.

After that, by selectively etching away the semiconductor substrate 11, the hole 82 for the first buried gate electrode 51, and the hole 82 for the second buried gate electrode 56 are formed.

After the hole 82 for the first buried gate electrode 51, and the hole 82 for the second buried gate electrode 56 have been formed, as shown in FIG. 7C, impurity ions are implanted into each of the circumference of the hole 82 for the first buried gate electrode 51, and the circumference of the hole 82 for the second buried gate electrode 56.

As a result, a P-type first impurity region 53 is formed in the circumference of the hole 82 for the first buried gate electrode 51. In addition, a P-type second impurity region 58 is formed in the circumference of the hole 82 for the second buried gate electrode 56.

When the P-type region is intended to be formed in the semiconductor substrate 11, for example, ions of boron (B), boron difluoride ($BF_2$) or the like have to be implanted as the impurity ions into the semiconductor substrate 11. In addition, an ion implanter such as an ion implantation system has to be used for the ion implantation.

After the P-type first impurity region 53 has been formed in the circumference of the hole 82 for the first buried gate electrode 51, and the P-type second impurity region 58 has been formed in the circumference of the hole 82 for the second buried gate electrode 56, the resist film 81 is removed away.

In addition, as shown in FIG. 7D, a polysilicon film 83 is formed on one surface side of the light receiving area 21 of the semiconductor substrate 11.

A part of the polysilicon film 83 is also formed in the inside of the hole 82 for the first buried gate electrode 51, and the hole 82 for the second buried gate electrode 56.

In addition, as shown in FIG. 7D, a new resist film 84 is formed on the polysilicon film 83.

The resist film 84 is formed above the hole 82 for the first buried gate electrode 51, and above the hole 82 for the second buried gate electrode 56.

In this case, the polysilicon film 83 is selectively etched away.

As a result, the first buried gate electrode 51 and the second buried gate electrode 56 are each formed on the semiconductor substrate 11.

Next, as shown in FIG. 7E, a new resist film 85 is formed on the semiconductor substrate 11.

The resist film 85 is formed on one surface side of the semiconductor substrate 11 other than the first buried gate electrode 51 and the circumference of the first buried gate electrode 51.

In addition, in a state in which the resist film 85 is formed, a small amount of N-type impurity ions is implanted into the semiconductor substrate 11.

When the N-type region is intended to be formed, for example, ions of arsenic (Ar), phosphorus (P) or the like as have to be implanted as impurity ions into the semiconductor substrate 11. In addition, the ion implantation system has to be used for the ion implantation.

The impurity ions implanted into the semiconductor substrate 11 are implanted to a position at a predetermined depth distant from one surface of the light receiving area 21 of the semiconductor substrate 11.

Also, a portion, of the P-type first impurity region 53, into which the N-type impurity ions are implanted becomes a P-type region which is lower in impurity concentration than the first impurity region 53.

As a result, the first channel formation region 54 is formed.

It is noted that as shown in FIG. 7E, the first channel formation region 54 at this time point is formed so as to slightly spread in a horizontal direction of FIG. 7E from the first impurity region 53.

After the resist film 85 is removed away, as shown in FIG. 7F, a new resist film 86 is formed on the semiconductor substrate 11.

The resist film 86 is formed on one surface side, of the semiconductor substrate 11, other than a half on the first buried gate electrode 51 side and the circumference of the first buried gate electrode 51 with respect to the second buried gate electrode 56.

In addition, in a state in which the resist film 86 is formed, a small amount of N-type impurity ions is implanted into the semiconductor substrate 11.

The N-type impurity ions are implanted to a position at a predetermined depth distant from the semiconductor substrate 11.

Also, a portion, of the P-type second impurity region 58, into which the N-type impurity ions are implanted becomes a P-type region which is lower in impurity concentration than the second impurity region 58.

As a result, the second channel formation region 59 is formed.

It is noted that as shown in FIG. 7F, the second channel formation region 59 at this time point is formed so as to slightly spread from one surface side of the second impurity region 58 to the first buried gate electrode 51 side.

The first transfer transistor 30 and the second transfer transistor 26 are each formed on the semiconductor substrate 11 through the manufacturing processes described above.

Next, as shown in FIG. 7G, a new resist film 87 is formed on the semiconductor substrate 11.

The resist film 87 is formed on one surface side of the semiconductor substrate 11 other than a portion between the isolation portion 71 and the first buried gate electrode 51.

In addition, in a state in which the resist film 87 is formed, P-type impurity ions and N-type impurity ions are implanted in order into the semiconductor substrate 11.

As a result, the buried photodiode 25 having the $P^+$-type region 61 and the N-type region 62 is formed on the semiconductor substrate 11.

In addition, the N-type region 62 contacts the first channel formation region 54.

Figure 7H:
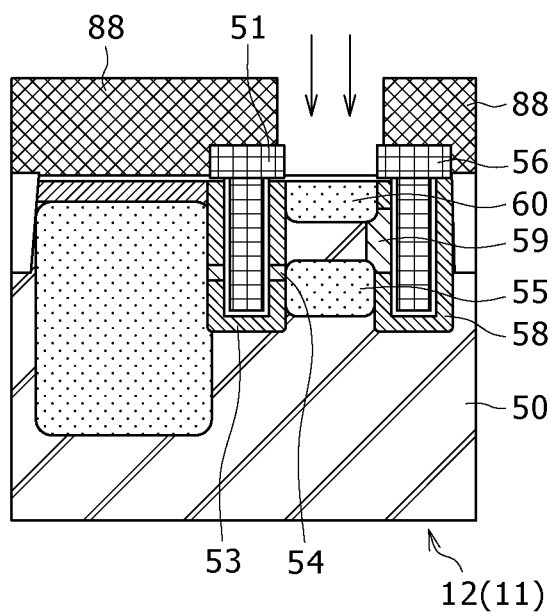

Next, as shown in FIG. 7H, a new resist film 88 is formed on the semiconductor substrate 11.

The resist film 88 is formed in a portion other than a portion between the first buried gate electrode 51 and the second buried gate electrode 56.

In addition, in a state in which the resist film 88 is formed, N-type impurity ions are implanted into the semiconductor substrate 11.

As a result, the buried diffusion layer 55 and the surface diffusion layer 60 are each formed on the semiconductor substrate 11.

Also, the surface diffusion layer 60 is formed on one surface side of the light receiving area 21 of the semiconductor substrate 11.

The surface diffusion layer 60 contacts the second channel formation region 59.

In addition, the buried diffusion layer 55 is formed so as to overlap and be remote from the surface diffusion layer 60 in the inside of the semiconductor substrate 11.

The buried diffusion layer 55 contacts each of the first channel formation region 54 and the second channel formation region 59.

After completion of the manufacturing processes shown in FIGS. 7A to 7H, respectively, the gate electrodes of the second transfer transistor 26, the reset transistor 27, the amplifying transistor 28, the selecting transistor 29, and the first transfer transistor 30 of the pixel circuit 22 are formed on one surface side of the light receiving area 21 of the semiconductor substrate 11.

As a result, a plurality of pixel circuits 22 are formed on the semiconductor substrate 11.

Also, in the pixel circuit 22 shown in FIG. 5 and formed in the manufacturing processes shown in FIGS. 7A to 7H, respectively, the potential at the first buried gate electrode 51, for example, is controlled so as to be set as the High level.

As a result, the electric charges generated in the photodiode 25 are moved to the buried diffusion layer 55 functioning as the holding portion 44 through the first channel formation region 54.

In addition, in the pixel circuit 22, the potential at the second buried gate electrode 56, for example, is controlled so as to be set as the High level.

As a result, the electric charges held in the buried diffusion layer 55 are moved to the surface diffusion layer 60 functioning as the floating diffusion FD through the second channel formation region 59. Lamination Structure and Manufacturing Method for Pixel Circuit 22 of Comparative Example FIG. 8 is a top plan view showing a schematic layout of a pixel circuit 22 of a comparative example with respect to the semiconductor substrate 11.

Figure 8:
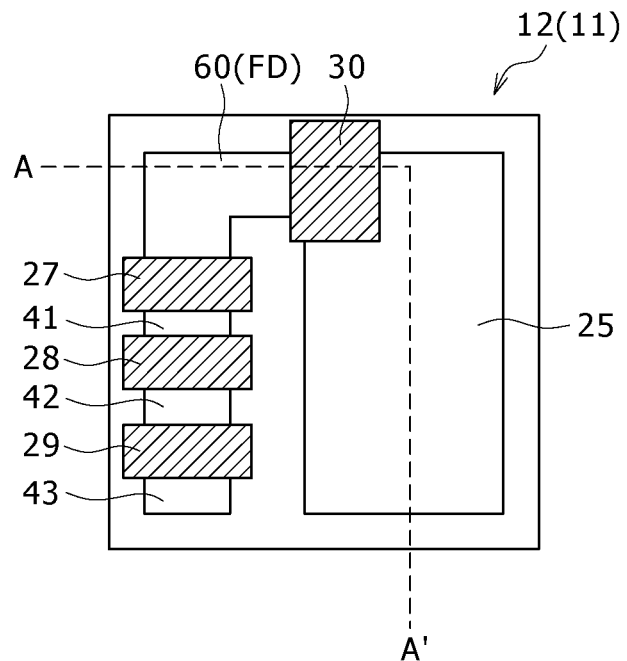
FIG. 8 is a top plan view showing a schematic layout of a pixel circuit of a comparative example with respect to a semiconductor substrate.
Figure 9:
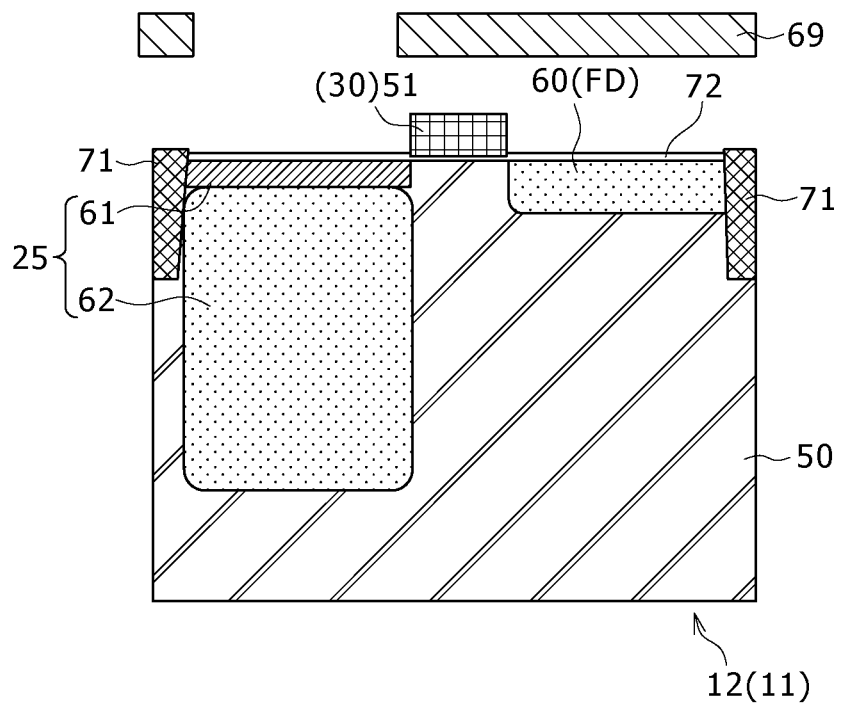
FIG. 9 is a cross sectional view taken on line A-A' of FIG. 8.

FIG. 9 is a longitudinal cross sectional view taken on line A-A' of FIG. 8. The longitudinal cross sectional view of FIG. 9 corresponds to the longitudinal cross sectional view of FIG. 5.

In the following description, portions of the pixel circuit 22 of the comparative example identical to or corresponding to those of the pixel circuit 22 in the CMOS image sensor 1 of the first embodiment are designed by the same reference numerals, respectively, for the sake of convenience of the description.

The pixel circuit 22 of the comparative example has basically the same lamination structure as that of the pixel circuit 22 in the CMOS image sensor 1 of the first embodiment shown in FIGS. 4 and 5.

However, the pixel circuit 22 of the comparative example is different from the pixel circuit 22 in the CMOS image sensor 1 of the first embodiment in that the first transfer transistor 30 has the gate electrode formed on one surface of the semiconductor substrate 11 similarly to the case of other transistors (that is, the reset transistor 27, the amplifying transistor 28, and the selecting transistor 29).

In addition, the pixel circuit 22 of the comparative example is different from the pixel circuit 22 in the CMOS image sensor 1 of the first embodiment in that the pixel circuit 22 of the comparative example includes none of the second transfer transistor 26 and the buried diffusion layer 55.

Also, in the pixel circuit 22 of the comparative example, the gate electrode of the first transfer transistor 30 is formed between the photodiode 25 and the surface diffusion layer 60 functioning as the floating diffusion FD.

In addition, in the pixel circuits 22 of the comparative example, the first transfer transistors 30 are controlled so as to be turned ON in order in a phase of the operation for reading out the data on the captured image from the pixel circuits 22.

In addition, in the CMOS image sensor 1 of the first embodiment, in the phase of the operation for reading out the data on the captured image from the pixel circuits 22, the operation for resetting the pixel circuit 22 is required as shown in FIG. 3.

For this reason, in the pixel circuit 22 of the comparative example, the data on the captured image needs to be read out from a plurality of pixel circuits 22 in accordance with the rolling shutter system.

In the pixel circuit 22 of the comparative example, the reading operation cannot be carried out in accordance with the global shutter system.

As has been described, in the CMOS image sensor 1 of the first embodiment, the first transfer transistor 30, the holding portion 44 and the second transfer transistor 26 are each connected between the photodiode 25 and the floating diffusion FD.

Thus, in the first embodiment of the present invention, the data on the captured image can be read out from the photodiodes 25 of a plurality of pixel circuits 22, respectively, in accordance with the global shutter system.

In addition, even in the case of the reading operation complying with the global shutter system, a value for which the kTC noise is suppressed is obtained in accordance with the CDS processing based on the operation for subtracting the count value of the P phase from the count value of the D phase.

In addition, in the pixel circuit 22 of the CMOS image sensor 1 of the first embodiment, the first transfer transistor 30 and the second transfer transistor 26 are formed so as to have the respective buried gate electrodes.

In addition, in the pixel circuit 22 of the CMOS image sensor 1 of the first embodiment, the buried diffusion layer 55 functioning as the holding portion 44 is formed below the surface diffusion layer 60 functioning as the floating diffusion FD so as to overlap in position the surface diffusion layer 60 functioning as the floating diffusion FD.

Therefore, when one surface side of the light receiving area 21 of the semiconductor substrate 11 is viewed, the area which both the surface diffusion layer 60 and the buried diffusion layer 55 use becomes an area of one diffusion layer.

As a result, the area of the photodiode 25 in the light receiving area 21 of the semiconductor substrate 11 is not reduced in spite of the provision of both the surface diffusion layer 60 and the buried diffusion layer 55.

Thus, the area of the photodiode 25 in one surface side of the light receiving area 21 of the semiconductor substrate 11 becomes equal to an area in the case where the pixel circuit 22 includes only the surface diffusion layer 60 of the floating diffusion FD.

In addition, by adopting the buried gate electrodes, in the low-voltage driven CMOS image sensor 1, the electric charges can be moved by using the buried diffusion layer 55 buried in the semiconductor substrate 11.

In addition, in the first embodiment of the present invention, of the surface diffusion layer 60 and the buried diffusion layer 55 which are formed so as to overlap in position each other, the buried diffusion layer 55 buried in the semiconductor substrate 11 is utilized as the holding portion 44 for holding the electric charges accumulated in the photodiode 25.

Therefore, the noises due to the surface electric charges of the semiconductor substrate 11 are not generated in the holding portion 44.

An amount of electric charges held in the holding portion 44 becomes an amount of electric charges generated in the photodiode 25, and thus the noise components are very less.

It is noted that when there are defects in the surface portion of the semiconductor substrate 11, the electric charges bubble from the defect portions to the surface portion of the semiconductor substrate 11. The electric charges thus bubbled become the noises.

2. Second Embodiment

A CMOS image sensor 1 according to a second embodiment of the present invention is such that one floating diffusion FD is formed for a plurality of pixel circuits 22.

Figure 10:
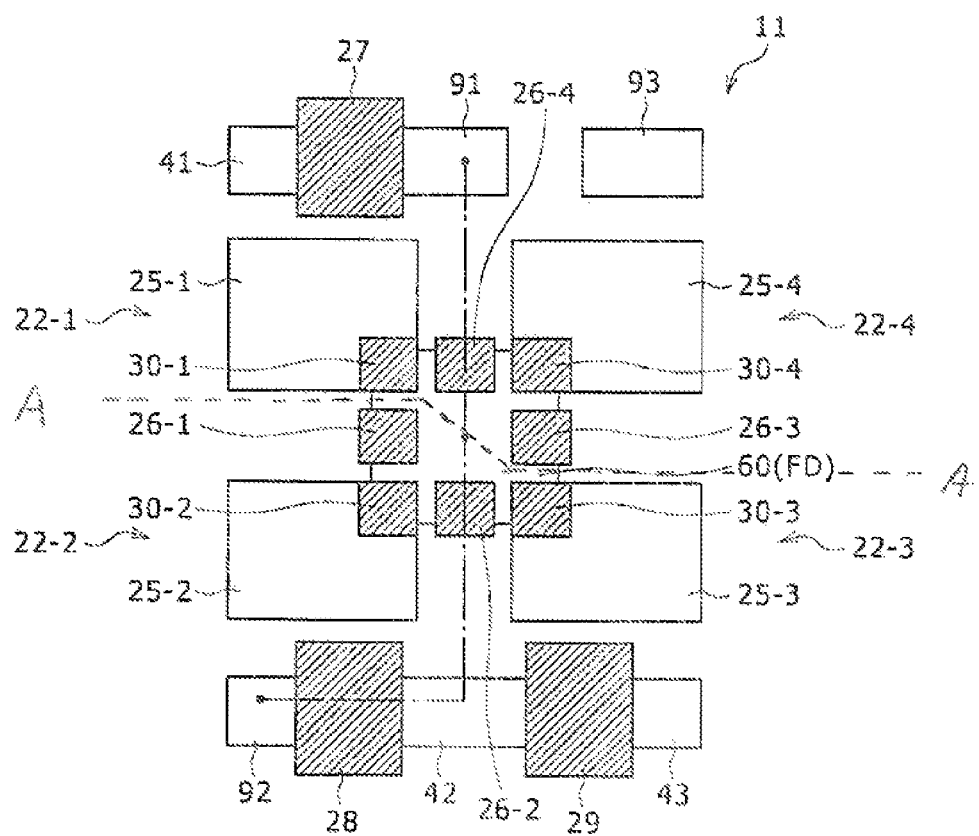
FIG. 10 is a top plan view showing a schematic layout of four pixel circuits formed on a semiconductor substrate of a CMOS image sensor according to a second embodiments of the present invention.

FIG. 10 is a top plan view showing a schematic layout of four pixel circuits 22 formed on the semiconductor substrate 11 in the CMOS image sensor 1 according to the second embodiment of the present invention.

The four (=2(row)×2(column)) pixel circuits 22 are shown in FIG. 10.

Also, as shown in FIG. 10, a plurality of pixel circuits 22 are formed on the semiconductor substrate 11 in the second embodiment based on a repetitive pattern for each four (=2(row)×2(column)) pixel circuits 22.

Specifically, a top-left pixel circuit 22-1 including a photodiode 25-1, a first transfer transistor 30-1, and a second transfer transistor 26-1 is formed in a top-left pixel circuit formation area shown in FIG. 10.

In addition, a bottom-left pixel circuit 22-2 including a photodiode 25-2, a first transfer transistor 30-2, and a second transfer transistor 26-2 is formed in a bottom-left pixel circuit formation area shown in FIG. 10.

In addition, a bottom-right pixel circuit 22-3 including a photodiode 25-3, a first transfer transistor 30-3, and a second transfer transistor 26-3 is formed in a bottom-right pixel circuit formation area shown in FIG. 10.

Also, a top-right pixel circuit 22-4 including a photodiode 25-4, a first transfer transistor 30-4, and a second transfer transistor 26-4 is formed in a top-right pixel circuit formation area shown in FIG. 10.

In addition, the surface diffusion layer 60 as one floating diffusion FD is formed among the four pixel circuits 22-1 to 22-4.

In addition, the four first transfer transistors 30-1 to 30-4 are formed between the surface diffusion layer 60, and the respective photodiodes 25-1 to 25-4.

Also, the four second transfer transistors 26-1 to 26-4 are each formed adjacent to the surface diffusion layer 60.

In addition, one reset transistor 27 is disposed on an upper side of FIG. 10 with respect to the four pixel circuits 22-1 to 22-4.

The wiring portion 41 connected to a power source voltage Vdd, and a wiring portion 91 connected to the surface diffusion layer 60 are connected to a left-hand side and a right-hand side of the gate electrode of the reset transistor 27, respectively.

In addition, a wiring portion 93 connected to the ground potential GND is formed on a right-hand side of a wiring portion 91.

Also, one amplifying transistor 28 and one selecting transistor 29 are disposed on a lower side of FIG. 10 with respect to four pixels 22-1 to 22-4.

A wiring portion 92 connected to the surface diffusion layer 60 is formed on the left-hand side of the gate electrode of the amplifying transistor 28.

The wiring portion 42 is formed between the amplifying transistor 28 and the selecting transistor 29.

The wiring portion 43 is formed on the right-hand side of the selecting transistor 29.

Figure 11:
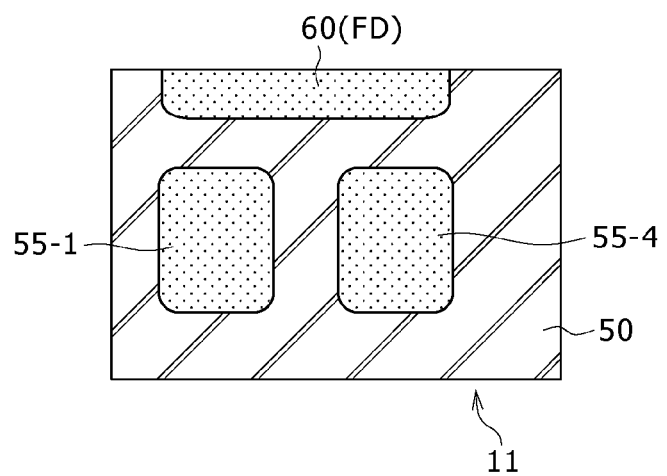
FIG. 11 is a longitudinal cross sectional view showing a structure of a portion in which a floating diffusion is formed in the semiconductor substrate shown in FIG. 10.

FIG. 11 is a cross sectional view of the semiconductor substrate 11 in the surface diffusion layer 60 as the floating diffusion FD of the FIG. 10 taken along line A-A.

Four buried diffusion layers 55-1 and 55-4 are formed in respective positions each being distant from the surface diffusion layer 60 on a lower side of the surface diffusion layer 60 which is formed so as to be exposed to the surface of the light receiving area 21 of the semiconductor substrate 11.

A top-left buried diffusion layer 55-1 which is shown in FIG. 11 is formed between the first transfer transistor 30-1 and the second transfer transistor 26-1 in FIG. 10.

A bottom-left buried diffusion layer 55-2 on the right-hand side which is not shown in FIG. 11 is formed between the first transfer transistor 30-2 and the second transfer transistor 26-2 in FIG. 10.

In addition, a third bottom-right diffusion layer 55-3 which is not shown in FIG. 11 is formed between the first transfer transistor 30-3 and the second transfer transistor 26-3 in FIG. 10.

Also, a fourth top-right diffusion layer 55-4 which is shown in FIG. 10 is formed between the first transfer transistor 30-4 and the second transfer transistor 26-4 in FIG. 10.

As has been described, in the second embodiment of the present invention, a plurality of pixel circuits 22 are formed on the semiconductor substrate 11 based on the repetitive pattern for each four (=2(row)×2(column)) pixel circuits 22.

Also, in the second embodiment of the present invention, the circuit elements such as the floating diffusion FD are shared among a plurality of pixel circuits 22.

As a result, in the second embodiment of the present invention, it is possible to reduce the number of floating diffusion FD, reset transistor 27, amplifying transistor 28, and selecting transistor 29 which are all formed in the light receiving area 21 of the semiconductor substrate 11.

Also, in the second embodiment, the area, on one surface side of the light receiving area 21 of the semiconductor substrate 11, of the photodiode 25 of a plurality of pixel circuits 22 can be increased by the area corresponding to the reduced number of floating diffusion FD, reset transistor 27, amplifying transistor 28, and selecting transistor 29. In addition, it is possible to increase the number of photodiodes 25.

3. Third Embodiment

Configuration of Image Pickup Apparatus

Figure 12:
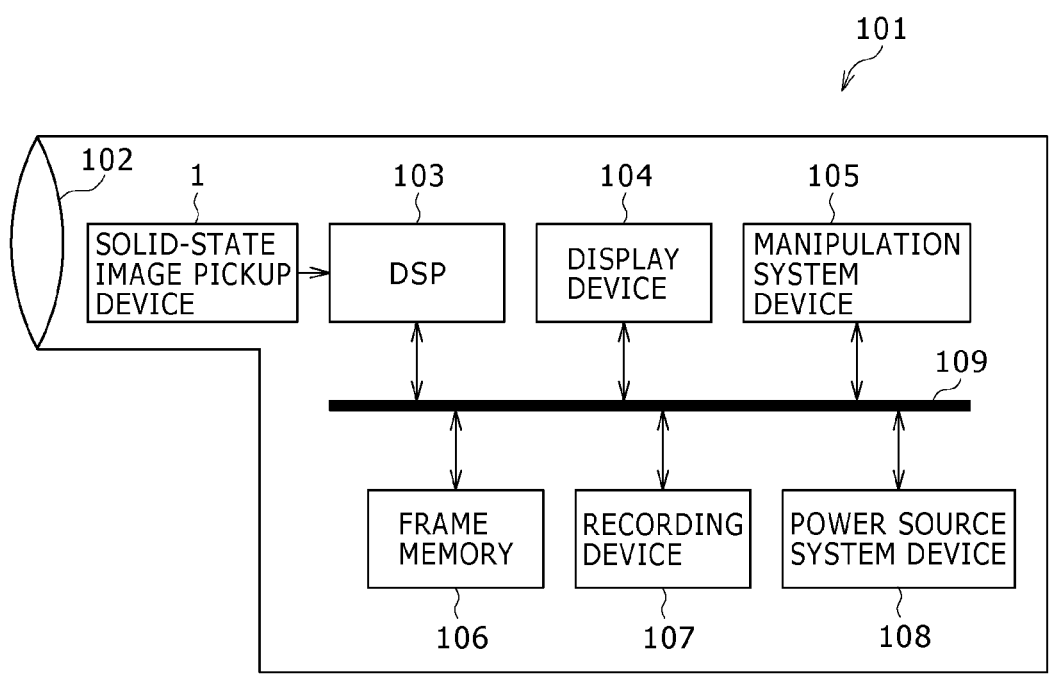
FIG. 12 is a block diagram showing a schematic configuration of a camera system as an image pickup apparatus according to a third embodiment of the present invention.

FIG. 12 shows a schematic configuration of a camera system 101 to which an image pickup apparatus according to a third embodiment of the present invention is applied.

The camera system 101 is either a digital still camera or a digital video camera to which the CMOS image sensor (solid-state image pickup device) 1 of any of the first and second embodiment described above is mounted.

It is noted that the camera system 101 may be incorporated as a camera module or the like in a mobile apparatus such as a mobile phone.

The camera system 101 shown in FIG. 12 includes a lens group 102 composing an optical system, the CMOS image sensor 1, a Digital Signal Processor (DSP) circuit 103, a display device 104, a manipulation system device 105, a frame memory 106, a recording device 107, and a power source system device 108.

The DSP circuit 103 is connected to the CMOS image sensor 1. The DSP circuit 103 processes data on an image which is captured by using the CMOS image sensor 1.

The DSP circuit 103, the display device 104, the manipulation system device 105, the frame memory 106, the recording device 107, and the power source system device 108 are all connected to one another through a bus line 109.

The lens group 102 condenses an incident light (image light) from a subject on the light receiving areas 21 of the CMOS image sensor 1. As a result, the subject is imaged on the light receiving areas 21.

The display device 104, for example, has a liquid crystal display panel or an organic Electro Luminescence (EL) panel. The display device 104 displays the image taken therein.

The manipulation system device 105, for example, has a touch panel and manipulation buttons.

Also, the manipulation system device 105 issues a control command to the CMOS image sensor 1, the DSP circuit 103, the display device 104, the recording device 107 or the power source system device 108.

The power source system device 108, for example, includes a battery or the like.

Also, the power source system device 108 supplies an electric power to each of the CMOS image sensor 1, the DSP circuit 103, the display device 104, the manipulation system device 105, and the recording device 107.

The recording device 107, for example, includes a semiconductor memory, an optical recording medium or the like.

Also, the recording device 107 records the data on the captured image either in the semiconductor memory or in the optical recording medium.

It is noted that the semiconductor memory, the optical recording medium or the like may be detachable from the camera system 101.

Description of Operation

For example, when either a still image or a moving image is captured, the CMOS image sensor 1 outputs distribution data, on the light quantities of received lights, which is read out from a plurality of pixel circuits.

The DSP circuit 103 processes the distribution data on the light quantities of received lights, thereby creating data on the captured image for one frame required for the camera system 101.

The frame memory 106 stores therein the data on the captured image.

The display device 104 reads out the data on the captured image from the frame memory 106, thereby displaying thereon the image corresponding to the data thus read out.

In addition, the recording device 107 takes in the data on the captured image in accordance with the command issued from the manipulation system device 105, and stores the data thus taken in a format corresponding to an image capturing mode.

In addition thereto, for example, when either the still image or moving image captured is displayed, the display device 104 reads out the data on the still image or the moving image thus captured from the recording device 107 and displays thereon either the still image or the moving image.

The first to third embodiments described above are merely the preferred embodiments of the present invention, and thus the present invention is by no means limited thereto. Therefore, various changes or modifications can be made without departing from the subject matter of the present invention.

For example, the solid-state image pickup device in each of the first to third embodiments described above is the CMOS image sensor 1.

In addition thereto, for example, the solid-state image pickup device may also be a Charge Coupled Device (CCD) image sensor.

In each of the first to third embodiments described above, one holding portion 44 (one buried diffusion layer 55) is formed in each of the pixel circuits 22.

In addition thereto, for example, a plurality of holding portions 44 (a plurality of buried diffusion layers 55) may also be formed in each of the pixel circuits 22. In this case, a plurality of buried diffusion layers 55 functioning as a plurality of holding portions 44 have to be formed so as to be stacked one upon another in a depth direction of the semiconductor substrate 11 and so as to overlap in position the surface diffusion layer 60.

The present application contains subject matter related to that disclosed in Japanese Priority Patent Application JP 2009-233226 filed in the Japan Patent Office on Oct. 7, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image pickup device, comprising:
a semiconductor substrate; and
a plurality of pixel circuits formed on said semiconductor substrate, said plurality of pixel circuits distributed horizontally on said semiconductor substrate,
wherein,
(a) each of said plurality of pixel circuits formed on said semiconductor substrate includes:
(1) a photoelectric conversion element that generates electric charges in response to incident light,
(2) a first buried gate electrode formed horizontally adjacent to said photoelectric conversion element,
(3) a second buried gate electrode formed horizontally spaced apart from each of said photoelectric conversion element and said first buried gate electrode,
(4) a first diffusion layer formed between said first buried gate electrode and said second buried gate electrode, and
(5) a second diffusion layer formed between said first buried gate electrode and said second buried gate electrode but vertically spaced apart from said first diffusion layer and horizontally overlapping said first diffusion layer; and
(b) electric charges accumulated in said photodiode conversion element are transferred to said second diffusion layer through said first diffusion layer.

2. The solid-state image pickup device according to claim 1, wherein:
said first diffusion layer is formed so as to be buried in said semiconductor substrate, and
said second diffusion layer is formed at one surface side of said semiconductor substrate.

3. The solid-state image pickup device according to claim 2, wherein:
the photoelectric conversion elements are formed at said one surface side of said semiconductor substrate in side by side relationship;
each of the photoelectric conversion elements further has a first impurity region of a first conductivity type, and a second impurity region of a second conductivity type contacting said first impurity region of the first conductivity type;
for each photoelectric conversion element, said first impurity region is formed at said one surface side with respect to said second impurity region;
for each photoelectric conversion element, each of said first diffusion layer and said second diffusion layer is formed so as to be of the second conductivity type; and
for each photoelectric conversion element, said solid-state image pickup device includes:
(a) the first impurity region of the first conductivity type formed in a circumference of said first buried gate electrode, and contacting each of said second impurity region of the second conductivity type of said photoelectric conversion element, said first diffusion layer of the second conductivity type, and said second diffusion layer of the second conductivity type,
(b) a first channel formation region formed as a first region of the first conductivity type which is lower in impurity concentration than said first impurity region of the first conductivity type in a part of said first impurity region of the first conductivity type, and contacting each of said second impurity region of the second conductivity type of said photoelectric conversion element and said first diffusion layer of the second conductivity type,
(c) the second impurity region of the first conductivity type formed in a circumference of said second buried gate electrode, and contacting each of said first diffusion layer of the second conductivity type and said second diffusion layer of the second conductivity type, and
(d) a second channel formation region formed as a second region of the first conductivity type which is lower in impurity concentration than said second impurity region of the second conductivity type in a part of said second impurity region of the second conductivity type, and contacting each of said first diffusion layer of the second conductivity type and said second diffusion layer of the second conductivity type.

4. The solid-state image pickup device according to claim 3, wherein, for each photoelectric conversion element, conductivity type impurity concentrations of said first channel formation region, said first diffusion layer, said second channel formation region, and said second diffusion layer are adjusted in such a way that when each of said first buried gate electrode and said second buried gate electrode is energized, an electric potential of said first channel formation region, an electric potential of said first diffusion layer, an electric potential of said second channel formation region, and an electric potential of said second diffusion layer become higher in succession, in this order, than that of said photoelectric conversion element.

5. An image pickup apparatus, comprising:
a solid-state image pickup device; and
an optical system for imaging an image of a subject on said solid-state image pickup device,
wherein, (a) said solid-state image pickup device includes:
  (1) a semiconductor substrate, and
  (2) a plurality of pixel circuits formed on said semiconductor substrate, said plurality of pixel circuits distributed horizontally on said semiconductor substrate;
(b) each of said plurality of pixel circuits formed on said semiconductor substrate includes:
  (1) a photoelectric conversion element that generates electric charges in response to incident light,
  (2) a first buried gate electrode formed horizontally adjacent to said photoelectric conversion element,
  (3) a second buried gate electrode formed horizontally spaced apart from each of said photoelectric conversion element and said first buried gate electrode,
  (4) a first diffusion layer formed between said first buried gate electrode and said second buried gate electrode, and
  (5) a second diffusion layer formed between said first buried gate electrode and said second buried gate electrode away but vertically spaced apart from said first diffusion layer and horizontally overlapping; and
(c) electric charges accumulated in said photodiode conversion element are transferred to said second diffusion layer through said first diffusion layer.

* * * * *